(12) United States Patent
Zang et al.

(10) Patent No.: US 9,818,689 B1
(45) Date of Patent: Nov. 14, 2017

(54) METAL-INSULATOR-METAL CAPACITOR AND METHODS OF FABRICATION

(71) Applicant: GLOBALFOUNDRIES Inc., Grand Cayman (KY)

(72) Inventors: Hui Zang, Guilderland, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/137,362

(22) Filed: Apr. 25, 2016

(51) Int. Cl.
   *H01L 23/52* (2006.01)
   *H01L 23/522* (2006.01)
   *H01L 23/528* (2006.01)
   *H01L 49/02* (2006.01)

(52) U.S. Cl.
   CPC ........ *H01L 23/5223* (2013.01); *H01L 23/528* (2013.01); *H01L 23/5226* (2013.01); *H01L 28/60* (2013.01)

(58) Field of Classification Search
   CPC .............................................. H01L 21/76807
   See application file for complete search history.

(56) References Cited

U.S. PATENT DOCUMENTS

| | | | |
|---|---|---|---|
| 7,038,266 B2 | 5/2006 | Wang | |
| 7,329,955 B2 | 2/2008 | Tsau | |
| 7,439,130 B2 * | 10/2008 | Park | H01L 21/7681 257/E21.019 |
| 8,946,854 B2 | 2/2015 | Feng et al. | |
| 2005/0121744 A1 * | 6/2005 | Chang | H01L 23/5223 257/532 |
| 2006/0234443 A1 * | 10/2006 | Yang | H01L 23/5223 438/253 |
| 2007/0296010 A1 * | 12/2007 | Su | H01L 21/743 257/301 |
| 2016/0268144 A1 * | 9/2016 | Voiron | H01L 23/5223 |

OTHER PUBLICATIONS

S. Jeannot et al. "Toward next high performance MIM generation: up to 30fF/um2 with 3D architecture and high-k materials", 2007 IEEE International Electron Devices Meeting, pp. 997-1000.

* cited by examiner

*Primary Examiner* — Fernando L Toledo
*Assistant Examiner* — Valerie N Newton
(74) *Attorney, Agent, or Firm* — Heslin Rothenberg Farley & Mesiti P.C.; Nathan Brian Davis (57) ABSTRACT

A method of forming a semiconductor structure, comprising forming a dual damascene structure having a capacitor trench and an interconnect trench, forming a first electrode a dielectric of the capacitor, and, depositing a metal within said capacitor trench and said interconnection trench wherein the metal forms a second electrode of the capacitor and also forms an interconnection between layers of an interconnecting structure of a semiconductor device. A semiconductor structure, comprising a dual damascene structure having a capacitor trench for a capacitor, the capacitor including a first electrode, a second electrode, and a high-K dielectric between the first and second electrodes, the high-k dielectric configured to seal the first electrode from the second electrode and from subsequent wiring layers of the interconnecting structure of the semiconductor device, and, an interconnection trench for a metal interconnection to form an interconnection between the interconnecting structure of the semiconductor device.

13 Claims, 11 Drawing Sheets

METAL-INSULATOR-METAL CAPACITOR AND METHODS OF FABRICATION

FIELD OF THE INVENTION

The present invention relates generally to semiconductor devices and methods of fabricating semiconductor devices, and, more particularly, to a metal-insulator-metal (MIM) capacitor and a method for integrating a MIM capacitor in back end of line (BEOL) wiring levels of a semiconductor integrated circuit (IC).

BACKGROUND OF THE INVENTION

A MIM capacitor is a component of an IC commonly used in high performance applications in complementary metal-oxide-semiconductor (CMOS) technology. The CMOS technology is used, for example, in microprocessors, microcontrollers, static RAM, and other digital logic circuits.

Typically, the MIM capacitor has a sandwich structure and can be described as a parallel plate capacitor. The capacitor top metal (CTM) is separated from the capacitor bottom metal (CBM) by a thin insulating dielectric layer. Both parallel plates are typically formed from Al or AlCu alloys that can be patterned and etched through the use of several photolithography photomasking steps. The thin insulating dielectric layer is typically made from silicon oxide or silicon nitride deposited by chemical vapor deposition (CVD).

With the development of the integrated circuit technology, the MIM capacitor has been widely used to improve the performance of the integrated circuit. Currently, in order to electrically connect the MIM capacitor with other electronic components of the IC, the MIM capacitor is usually integrated with an interconnection structure. However, in a conventional process for integrating the MIM capacitor with the interconnection structure, it is necessary to form a number of insulating layers and a number of metal layers. Thus, the conventional process for integrating the MIM capacitor with the interconnection structure requires a number of depositing steps and etching steps, thereby increasing the production cost and causing the final integrated structure to be complicated.

Copper-based chips are semiconductor integrated circuits that use copper for interconnections between the metallization layers of the IC. Since copper is a better conductor than aluminum, chips using this technology can have smaller metal components and use less energy to pass electricity through them. Together, these effects lead to higher performance processors.

Subtractive etch, the approach used in fabricating aluminum-based interconnects is inapplicable in the fabrication of copper-based interconnects (or interconnections), due to the lack of volatility of copper-halide complexes at moderate temperatures. As a result, copper interconnect fabrication requires a damascene approach whereby the metallization is inlaid into interconnect geometries which are pattern-transferred into the dielectric of interest. A dual damascene process also offers lower fabrication cost due to the limited use of chemical-mechanical planarization (CMP) processes compared to the multiple uses of this unit process in the subtractive etch fabrication of interconnects. However, the dielectric etches and metal fill processes of the dual damascene process face higher aspect ratios due to the dual damascene structure.

Dual Damascene copper interconnects may be fabricated using two primary schemes; via first scheme or trench first scheme. In the self-aligned approach the via level dielectric, or interlayer dielectric (ILD) and an etch stop layer (typically silicon nitride or silicon carbide for inorganic ILDs and oxide for organic ILDs) are sequentially deposited, followed by pattern and etch of via into the etch stop layer. The trench features are delineated into this dielectric and the trench etch is extended to complete transferring the via pattern from the etch stop layer into the interlayer dielectric. The etch stop layer defines the trench height, while maintaining a vertical profile of the via sidewall. The etch stop layer is removed from the bottom of the trench during the final etch step, which simultaneously clears the dielectric barrier from the bottom of the via.

Disadvantages of the self-aligned approach include the need for an etch stop layer (which increases sidewall capacitance), the need for high etch selectivity to the etch stop layer and susceptibility to partial via definition if trench and via are misaligned. Partial vias present a potential reliability issue and, thus, this integration scheme should be avoided unless ample alignment tolerance is provided in the product design.

Intervening etch stop layers in via/trench architecture degrade the effective capacitance of the structure and such layers are undesirable.

SUMMARY OF THE INVENTION

According to aspects illustrated herein, there is provided a method of forming a semiconductor structure, the method including the steps of forming a dual damascene structure having a capacitor trench and an interconnect trench, forming a first electrode of the capacitor, forming a dielectric of the capacitor, and, depositing a metal within said capacitor trench and said interconnect trench wherein said metal forms a second electrode of the capacitor and said metal also forms an interconnection between layers of an interconnecting structure of a semiconductor device.

According to aspects illustrated herein, there is provided a method of forming a semiconductor structure, the method including the steps of forming a dual damascene structure having a first capacitor trench and a first interconnect trench, forming a first electrode of the first capacitor, forming a first dielectric of the first capacitor, depositing a first metal within said first capacitor trench and said first interconnect trench wherein said first metal forms a second electrode of the first capacitor and said first metal also forms a first interconnection between wiring layers of the semiconductor device, forming a subsequent wiring level including a second capacitor trench for a second capacitor and a second interconnect trench for a second interconnect, forming a third electrode of the second capacitor, forming a second dielectric of the second capacitor, and, depositing a second metal within said second capacitor trench and said second interconnect trench wherein said second metal forms a fourth electrode of the second capacitor and said second metal also forms a second interconnection between wiring layers of the semiconductor device According to aspects illustrated herein, there is provided a semiconductor structure for an interconnecting structure of a semiconductor device, including a dual damascene structure having a capacitor trench for a capacitor, the capacitor including a first electrode, a second electrode, and a high-K dielectric between the first and second electrodes, the high-k dielectric configured to seal the first electrode from the second electrode and configured to seal the first electrode from subsequent wiring layers of the interconnecting structure of the semiconductor device, and, an interconnection trench for a metal interconnection to form an interconnection between the interconnecting structure of the semiconductor device The present invention only requires the use of a single mask instead of two masks like typical fabrication processes. Further, the present invention enables the fabrication of a capacitor structure with electrodes simultaneously formed with interconnection. Thus, there is no extra topology on the MIM capacitor area, enabling a simpler and more robust process. Other advantages include, by way of example, a higher capacitance density, low series resistance, low cost by removing one mask layer, no alignment mark issue, same topology at MIM capacitor area for robust contact formation, and can double the capacitor density by vertical stacking MIM cap.

Additional features and advantages are realized through the techniques of the present invention. Other embodiments and aspects of the invention are described in detail herein and are considered a part of the claimed invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

Note also that reference is made below to the drawings, which are not drawn to scale for ease of understanding, wherein the same reference numbers used throughout different figures designate the same or similar components. For the sake of clarity, only those elements and reference characters which are of relevance to the shown aspects of the respective embodiment of the present invention are shown repeatedly. In this regard, no attempt is made to show structural details of the invention in more detail than is necessary for a fundamental understanding of the invention, the description taken with the drawings making apparent to those skilled in the art how the several forms of the invention may be embodied in practice.

Unless defined otherwise, all technical and scientific terms used herein have the same meaning as commonly understood to one of ordinary skill in the art to which this invention belongs. Although any methods, devices or materials similar or equivalent to those described herein can be used in the practice or testing of the invention, the preferred methods, devices, and materials are now described.

Figure 1:
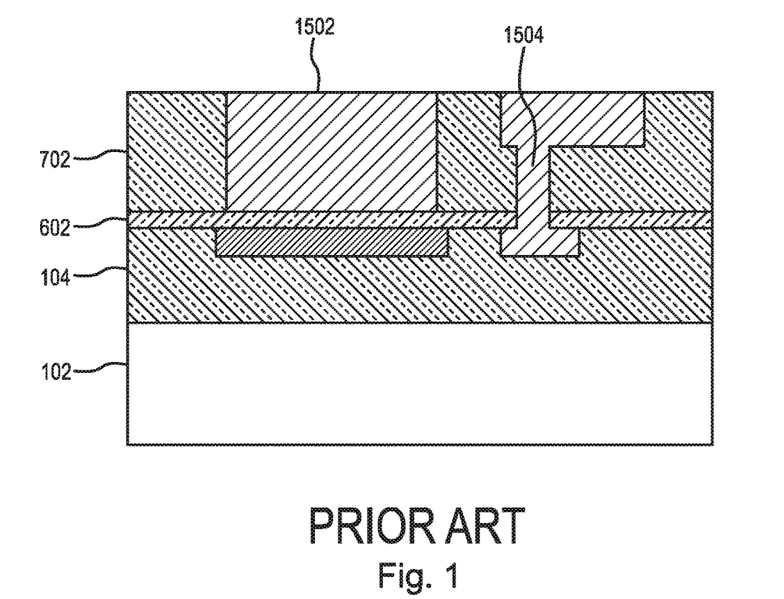
FIG. 1 is an illustration of a Prior Art MIM capacitor.

FIG. 1 is a MIM capacitor made according to a copper dual-damascene process as described in U.S. Pat. No. 8,946,854. The MIM capacitor having substrate 102, first dielectric layer 104, etch stop layer 602, dielectric layer 702, upper plate 1502 and filled via 1504. The described MIM capacitor has a first copper or copper alloy metal layer formed on substrate 102. A portion of the first metal layer is utilized as the lower plate of the MIM capacitor. Etch stop dielectric layer 602 is used during etching of subsequent layers. A portion of etch stop layer 602 is not removed and is utilized as the insulator for the MIM capacitor. A second copper or copper alloy metal layer is later formed on the substrate. A portion of the second metal layer is utilized as the upper plate 1502 of the MIM capacitor.

Another MIM capacitor is described in U.S. Pat. No. 8,946,854 as including a first dielectric layer, a first damascene electrode layer, an insulating barrier layer, a second dielectric layer and a second damascene electrode layer. The first damascene electrode layer serves as the bottom electrode of the MIM capacitor and is formed in the first dielectric layer. The insulating barrier layer serves as the insulating layer of the MIM capacitor and covers the first dielectric layer and the first damascene electrode layer, and is a single layer structure. The second dielectric layer is formed on the insulating barrier layer. The second damascene electrode layer forms the top electrode of the MIM capacitor and is formed in the second dielectric layer and is contacted with the insulating barrier layer.

Figure 2:
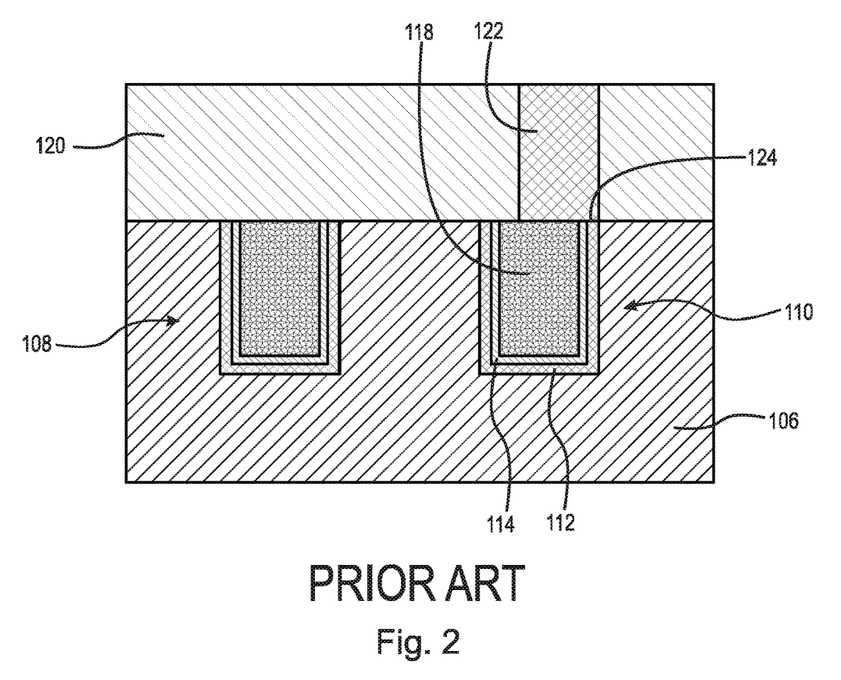
FIG. 2 is an illustration of a Prior Art MIM capacitor.

A problem with typical MIM capacitors is illustrated in FIG. 2. Again, there is substrate 106 that houses capacitors 108 and 110 in trenches. Capacitor 110 has bottom metal layer 112, insulator layer 114, and top metal electrode 118. The next layer of the semiconductor includes oxide 120 with interconnect 122, which is made from a conductive material. Interconnect 122 is usually designed to contact electrode 118 of the lower semiconductor layer, but due to misalignment it is possible that interconnect 122 contacts bottom metal layer 112 at interface 124 as well as contacting electrode 118. This causes the circuit to short out, which of course is undesirable.

Figure 3:
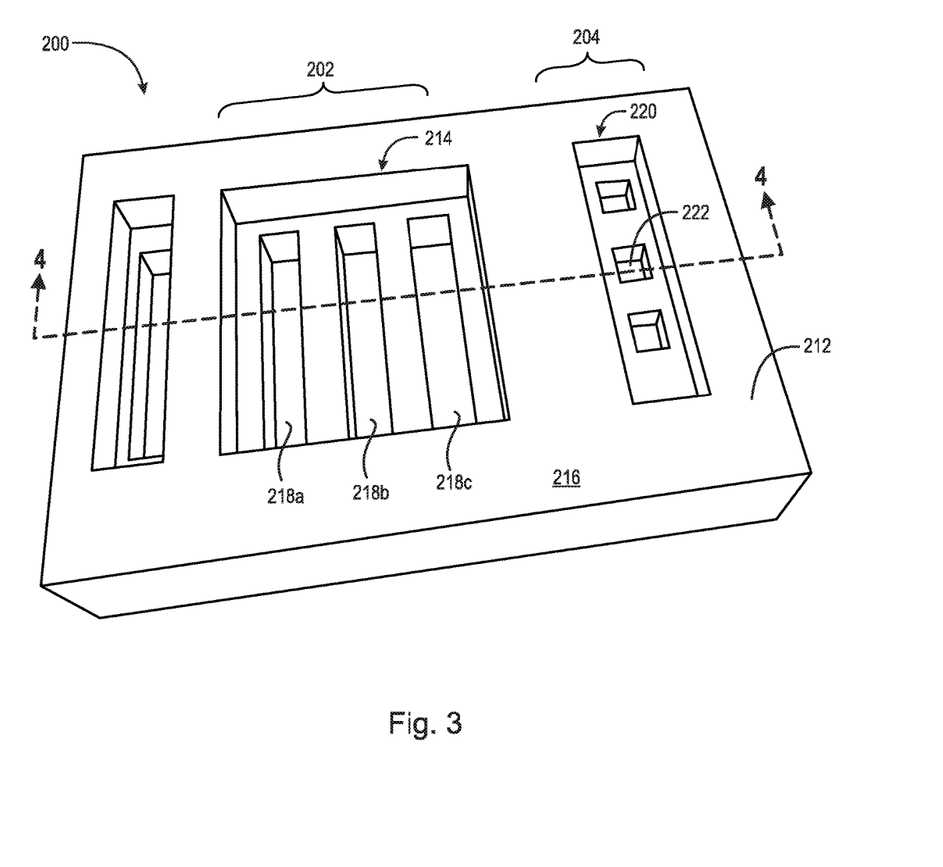
FIG. 3 is a perspective view of a dual damascene structure, according to an embodiment of the present invention.
Figure 4:
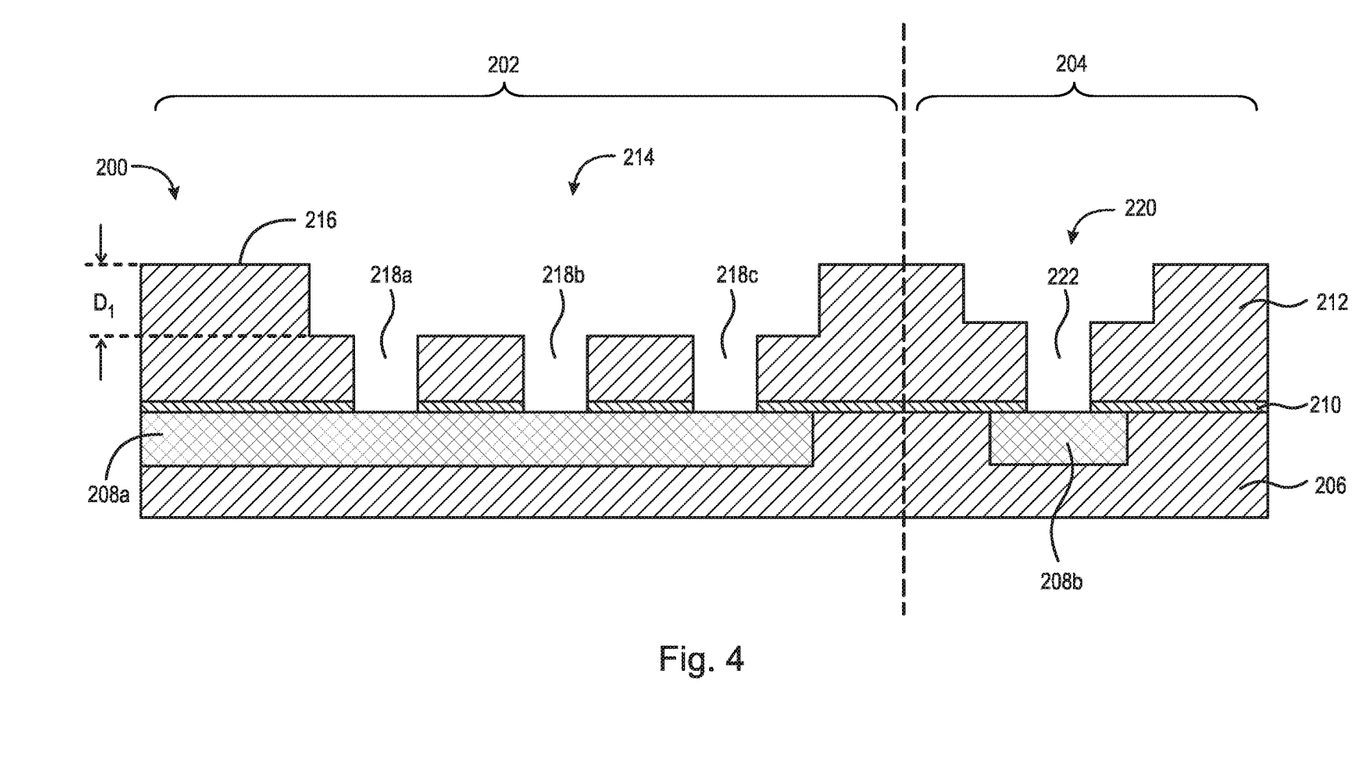
FIG. 4 is a cross-sectional view of the dual damascene structure along line 4-4 as shown in FIG. 3, according to an embodiment of the present invention.

FIG. 3 is a perspective view of dual damascene structure 200, according to an embodiment of the present invention, and FIG. 4 is a cross-sectional view of dual damascene structure 200 along line 4-4 as shown in FIG. 3.

The following should be taken with respect to FIGS. 3 and 4. Structure 200 has MIM capacitor region 202 and contact via region, or interconnection region, 204. Structure 200 has a first wiring level with oxide 206 that has bottom contact 208a for the MIM capacitor region, and bottom contact 208b for the interconnection region. A substrate (not shown), is generally located below the oxide and can be formed from silicon, silicon dioxide, aluminum oxide, germanium or an alloy of silicon and germanium. In short, structure 200 is an exemplary semiconductor structure following the completion (through etch, liner deposition, metal fill, planarization, etc.) of a first (lower) wiring level. The first wiring level includes contacts 208a and 208b, which contacts can be formed from copper. Barrier layer 210 can be formed from silicon nitride (SiN) and separates the lower wiring level from a second (i.e., subsequent) wiring level. The second wiring level includes top dielectric layer 212, in which will include a MIM capacitor and an interconnection. Dielectric layer 212 can be formed, for example, from tetra-ethylorthosilicate (TEOS) or fluorinated tetra-ethylorthosilicate (FTEOS)

MIM capacitor region 202 of structure 200 has trench 214 extending into top layer 212 from top planar surface 216 of the top layer by a distance D1, but does not extend down to barrier layer 210 below top layer 212. Vias 218a, 218b, 218c, extend from trench 214 through barrier layer 210 to expose bottom contact 208a.

Interconnection region 204 has trench 220 extending into top layer 212 from top planar surface 216 of the top layer by the same distance D1 as trench 214 of the MIM capacitor region. Via 222 extends from trench 220 through barrier layer 210 to expose bottom contact 208b.

Figure 5:
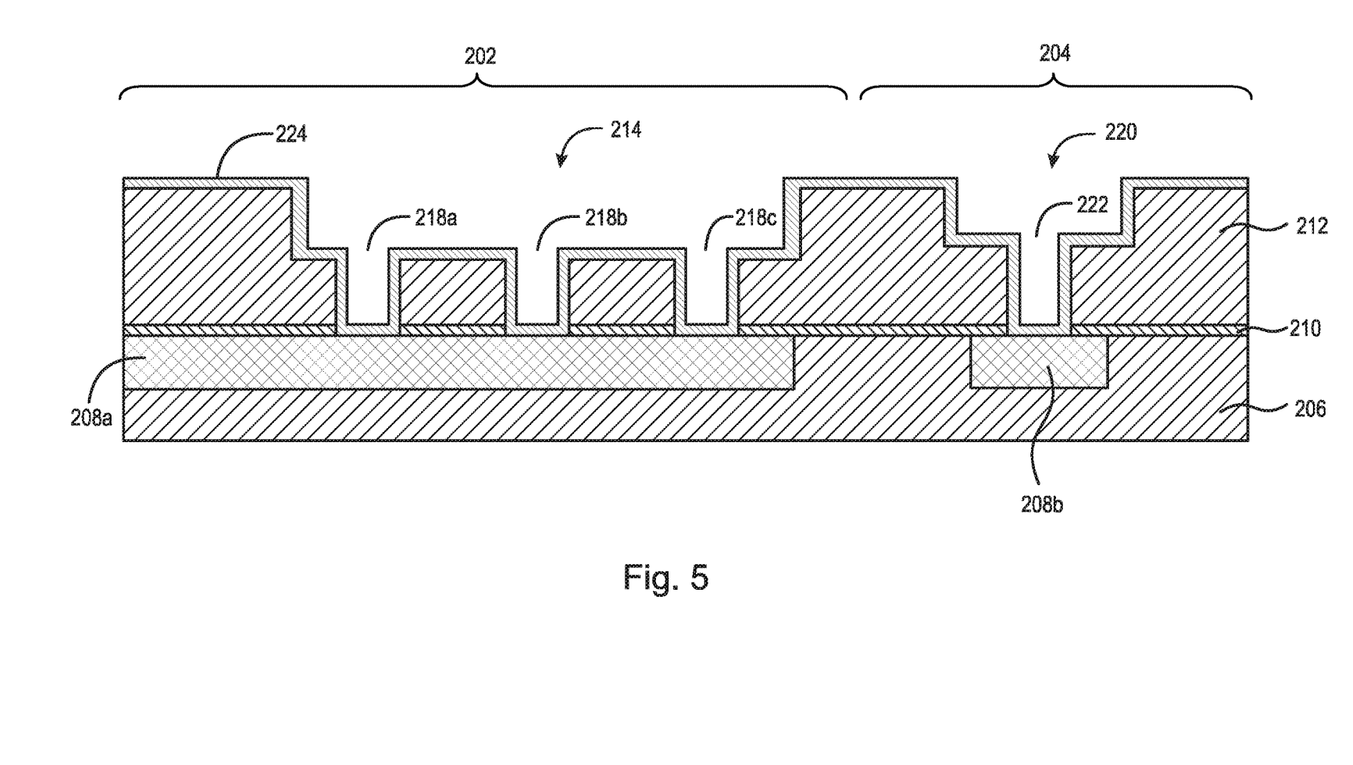
FIG. 5 is a cross-sectional view of a semiconductor structure in an intermediate stage of fabrication, according to an embodiment of the present invention.

FIG. 5 is a cross-sectional view of dual damascene structure 200, shown in FIGS. 3 and 4, with metal layer 224 deposited over the structure in an intermediate stage of fabricating a MIM capacitor according to an embodiment of the present invention. Metal layer 224 is deposited over both MIM capacitor region 202 and interconnection region 204. Due to vias 218a, 218b, and 218c in MIM capacitor region 202 extending through barrier layer 210, at least a portion of metal layer 224 contacts bottom contact 208a. Similarly, due to via 222 in interconnection region 204 extending through barrier layer 210, at least a portion of metal layer 224 contacts bottom contact 208b. Metal layer 224 may be formed, for example, from titanium nitride (TiN), tantalum (Ta), or tantalum nitride (TaN).

Figure 6:
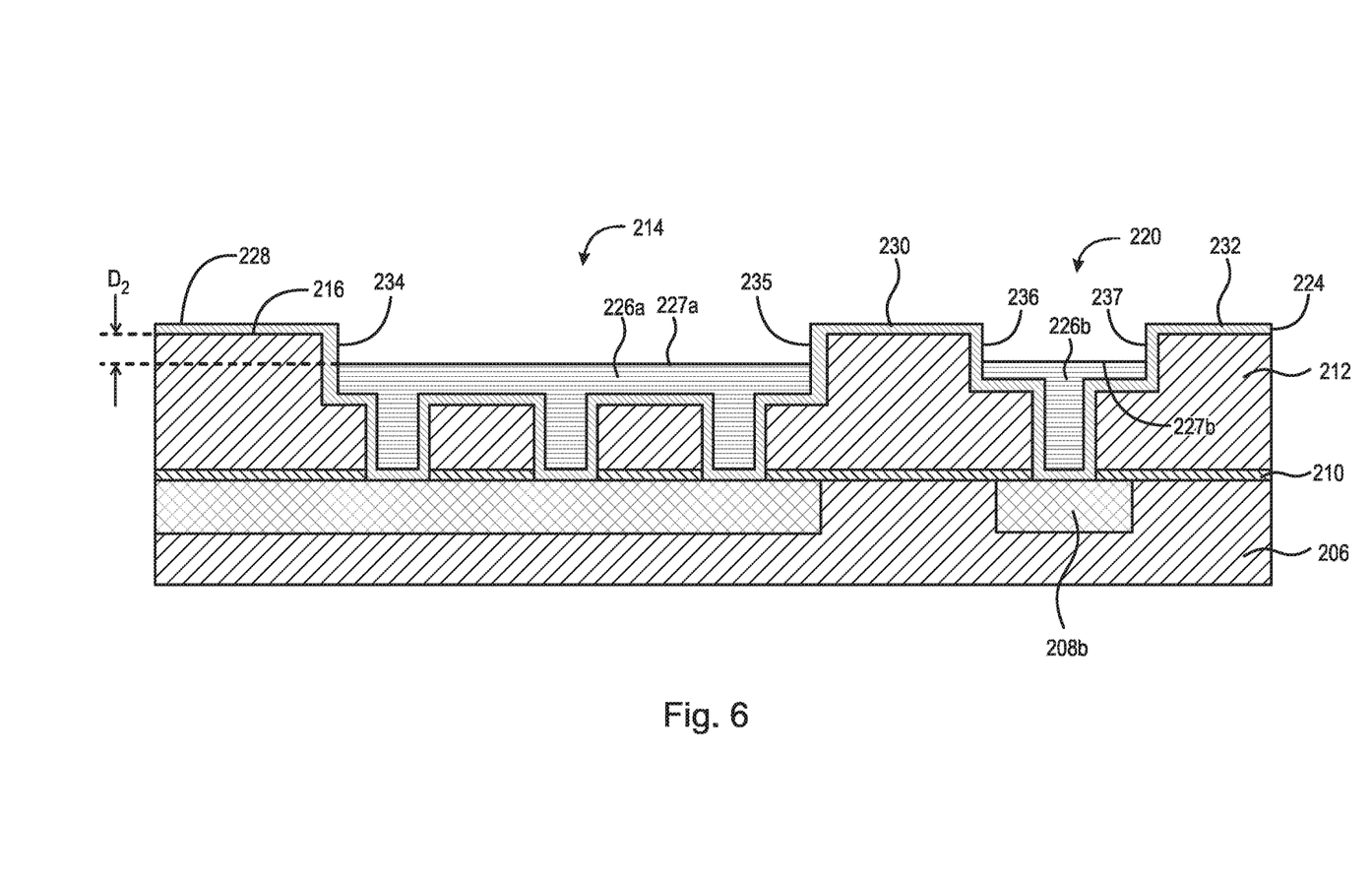
FIG. 6 is a cross-sectional view of a semiconductor structure in an intermediate stage of fabrication, according to an embodiment of the present invention.

FIG. 6 is a cross-sectional view of an intermediate stage of fabrication a MIM capacitor according to an embodiment of the present invention. Organic planarization layers (OPL or ODL) 226a in MIM capacitor trench 214, and OPL 226b in interconnection trench 220, are deposited as a single layer (not shown) over metal layer 224. The single layer (not shown) is subsequently etched back using, for example, lithography, so that top horizontal surfaces 227a, 227b of OPL 226a, 226b are below top planar surface 216 of top dielectric layer 212 by a distance D2 in both trenches 214 and 220, in the MIM capacitor and interconnection regions, respectively. In this way, OPL 226a and 226b fill trenches 214 and 220, respectively, and expose at least a portion of metal layer 224. In the embodiment shown, first, second, and third horizontal surfaces 228, 230, and 232, respectively, of metal layer 224 are exposed. Further, first and second vertical surfaces 234 and 235, respectively, of metal layer 224 in the MIM capacitor region are exposed, and third and fourth vertical surfaces 236 and 237 of metal layer 224 in the interconnection region are exposed. The OPL layers are, in general, a carbon photo resistant material.

The exposed portion, or portions, of metal layer 224 not covered by OPL 226 are then striped or etched down, for example using lithographic processes, down to top surfaces 227a and 227b of OPL 226a and 226b, respectively.

Figure 7:
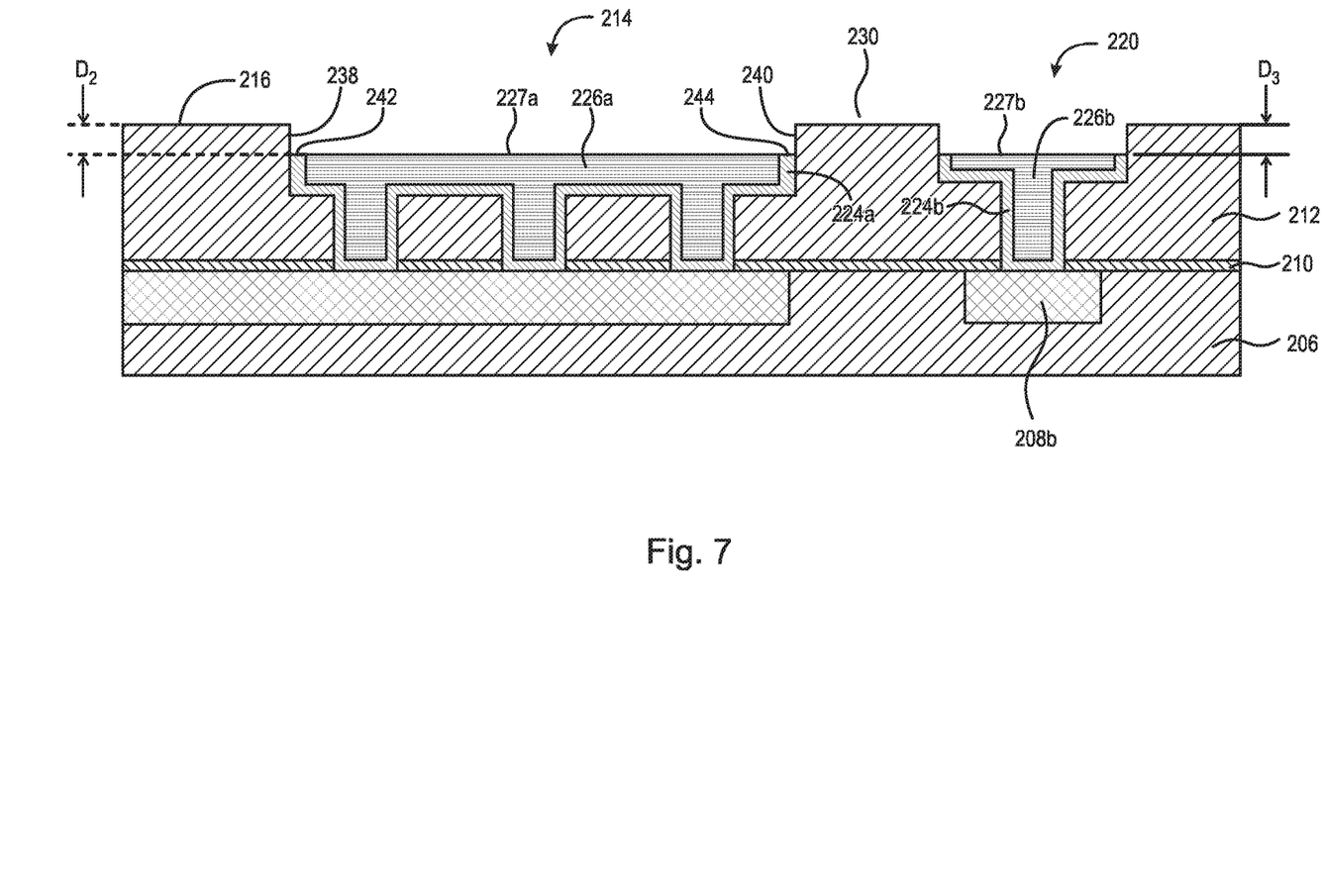
FIG. 7 is a cross-sectional view of a semiconductor structure in an intermediate stage of fabrication, according to an embodiment of the present invention.

FIG. 7 is a cross-sectional view of an intermediate stage of fabrication of a MIM capacitor according to an embodiment of the present invention. In FIG. 7, single metal layer 224 as shown in FIG. 6 has been striped or etched down, for example using lithographic processes, where it was not covered by OPL 226a and 226b, and only metal linings 224a and 224b remain. The striping process does not planarize top planar surface 216 of top dielectric layer 212 to be flush with OPL 226a and 226b. Instead, the striping process merely exposes top planar surface 216 of top dielectric layer 212 as well as vertical segments 238 and 240 of the top dielectric layer within trench 214. Similar vertical segments of the top dielectric layer are exposed within interconnection trench 220.

Metal lining 224a covered by OPL 226a has first and second horizontal surfaces 242 and 244 flush with top surface 227a of OPL 226a. Horizontal surfaces 242 and 244 of metal lining 224a are configured to be below top planar surface 216 of top dielectric layer 212 by a distance of D2. The importance of which will be discussed in more detail with respect to FIGS. 10 and 11.

Figure 8:
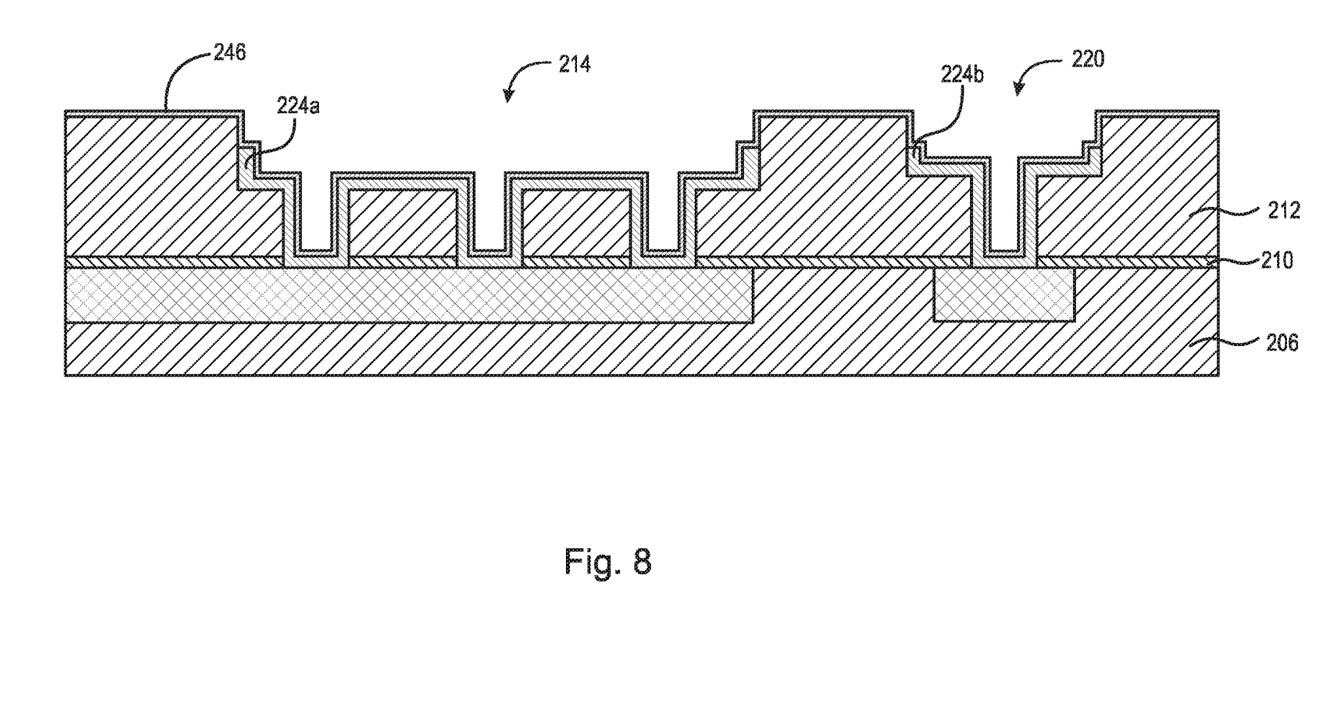
FIG. 8 is a cross-sectional view of a semiconductor structure in an intermediate stage of fabrication, according to an embodiment of the present invention.

FIG. 8 is a cross-sectional view of an intermediate stage of fabrication of a MIM capacitor according to an embodiment of the present invention. In FIG. 8, high-K dielectric layer 246 is deposited over both the MIM capacitor region and the interconnection region. As a result, at least a portion of high-K dielectric layer 246 is in direct contact with upper dielectric layer 212, while at least another portion directly contacts metal liners 224a or 224b. High-K dielectric layer 246 is formed from a material having a K value greater than $SiO_2$, for example hafnium oxide ($HfO_2$), aluminum oxide ($Al_2O_3$), hafnium aluminum oxide (HfAlO), nitrogen doped hafnium oxide (HfNO), or any combination of them.

Figure 9:
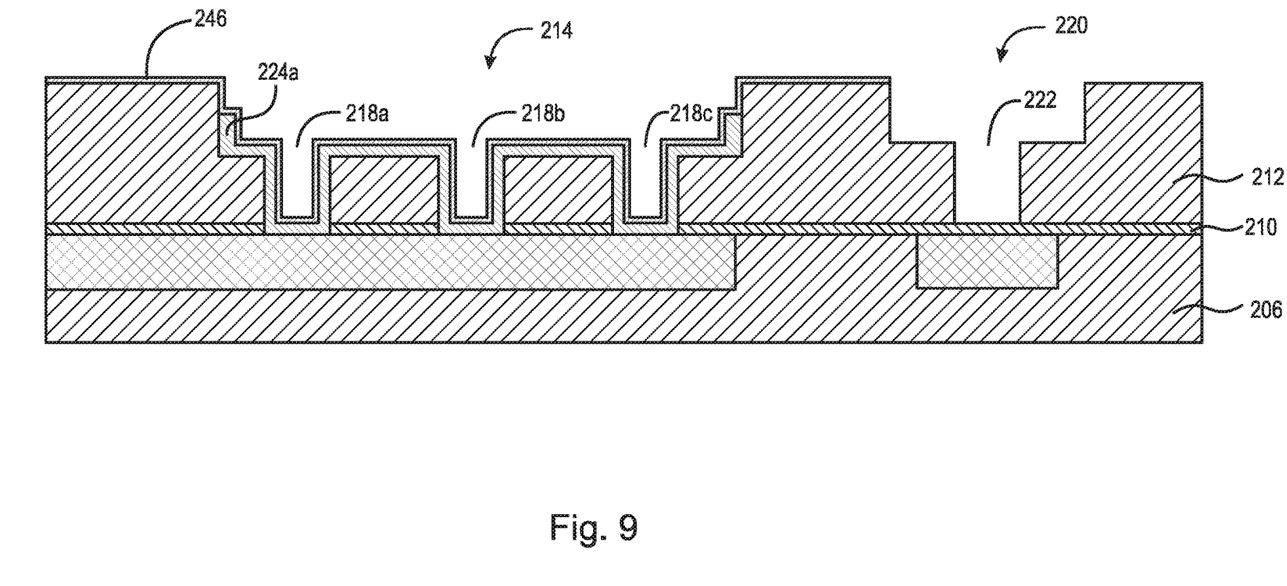
FIG. 9 is a cross-sectional view of a semiconductor structure in an intermediate stage of fabrication, according to an embodiment of the present invention.

FIG. 9 is a cross-sectional view of an intermediate stage of fabrication of a MIM capacitor according to an embodiment of the present invention. In FIG. 9, high-K dielectric layer 246 and metal liner 224b (shown in FIG. 8) have been selectively removed from at least interconnection trench 220 and interconnection via 222 by use of a mask (not shown) covering at least MIM capacitor trench 214 and vias 218a, 218b, and 218c.

Figure 10:
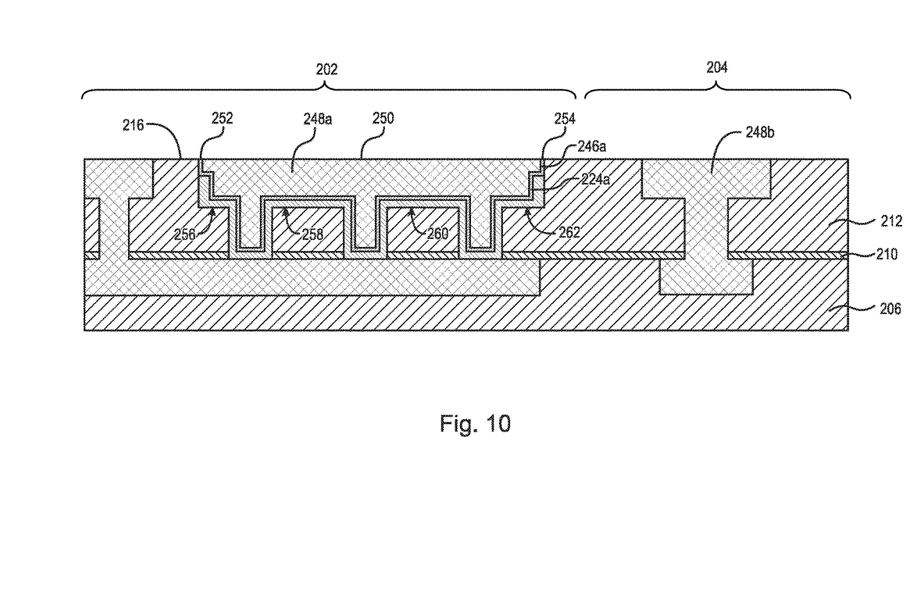
FIG. 10 is a cross-sectional view of an embodiment of the present invention, according to an embodiment of the present invention.

FIG. 10 is a cross-sectional view of an embodiment is a cross-sectional view of an exemplary embodiment of the present invention. Copper fill 248a in MIM capacitor region 202, and copper fill 248b in interconnection region 204, are deposited as a single layer (not shown) over both the MIM capacitor region and the interconnection region in the same step. The structure is then subsequently subjected to CMP such that the copper fill and the high-K dielectric layer 246 (labelled in FIG. 9) is removed from areas not within the trench of MIM capacitor region 202, and creates a high-K dielectric layer, or liner, 246a within the trench of MIM capacitor region 202. As a result, top surface 216 of top dielectric layer 212 is flush with top surface 250 of copper fill 248a, and top surfaces 252 and 254 of high-K dielectric layer 246a are flush with the top surfaces of the top dielectric layer and the copper fill.

In the exemplary embodiment shown in FIG. 10, metal liner 224a is the bottom electrode of a MIM capacitor, high-K dielectric layer 246a is the insulator of the MIM capacitor, and copper fill 248a is the top electrode of the MIM capacitor. In general, the capacitance of a capacitor can be defined as:

$$C = \kappa \frac{A}{d},$$

where κ is the dielectric constant of the material between the conductive plates, A is the area of overlap between the conductive plates, and d is the distance between the two conductive plates. With the area of overlap between bottom metal electrode 246a and top electrode 248a of the present invention including not only the height and width of trenches 218a, 218b, and 218c, but also the width of horizontal surfaces 256, 258, 260, and 262 before, after and between vias 218a, 218b, and 218c, the capacitance of the MIM capacitor is increased over prior art MIM capacitors. Further, with metal layer 224a recessed into trench 214, high-K dielectric layer 246a completely seals metal layer 224a from top electrode 248a and any metal in above metallization layers, thereby preventing the shorting out of the circuit.

Figure 11:
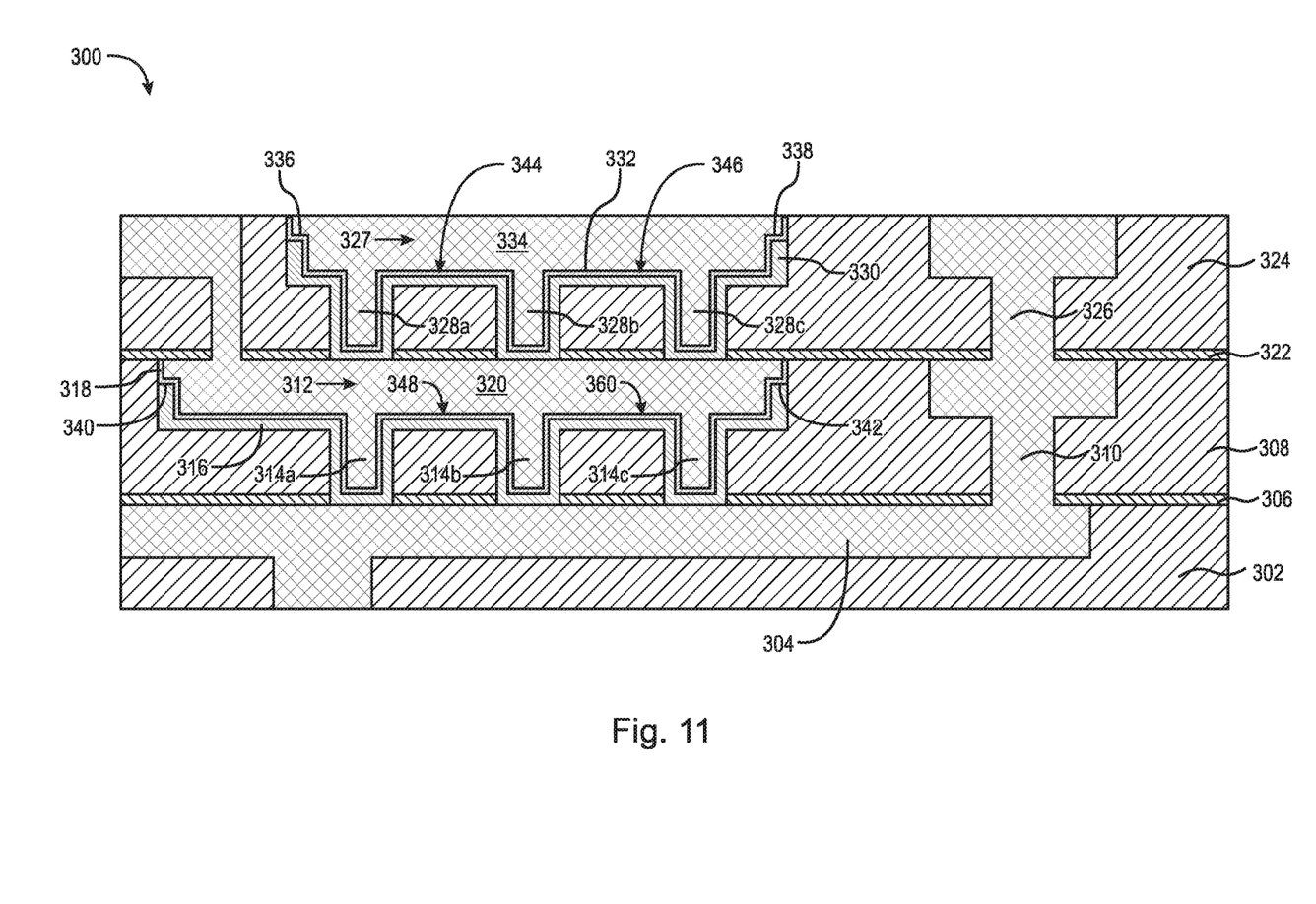
FIG. 11 is a cross-sectional view of a stacked embodiment of the present invention; and, FIG. 12 is a flow diagram illustrating a method of fabrication for a semiconductor structure according to an embodiment of the present invention.

FIG. 11 is a cross-sectional view of exemplary embodiment 300 according to the present invention in which there are stacked MIM capacitors in stacked metallization layers of an IC. The materials used in the embodiment depicted in FIG. 11 are similar to the prior described embodiment. In embodiment 300, the first wiring level includes substrate 302 housing contact 304. Barrier layer 306 separates the first wiring level from a second wiring level. The second wiring level includes substrate 308 housing interconnection 310, and having capacitor trench 312 with vias 314a, 314b, and 314c. The MIM capacitor in the second wiring level has bottom metal layer 316, high-K dielectric layer 318, and top electrode 320.

Barrier layer 322 separates the second wiring level from a third wiring level. The third wiring level includes substrate 324 housing interconnection 326, and having capacitor trench 334 with vias 328a, 328b, and 328c. The MIM capacitor in the third wiring level has bottom metal layer 330, high-K dielectric layer 332, and top electrode 334.

In the exemplary embodiment shown in FIG. 11, bottom metal layers 316 of the second wiring layer, and 330 of the third wiring layer do not extend all the way through to the next wiring layer. Instead, bottom metal layer 330 of the third wiring layer has top surfaces 336 and 338 that do not line the entirety of capacitor trench 327. Similarly, bottom metal layer 330 of the second wiring layer has top surfaces 340 and 342 that do not line the entirety of capacitor trench 312. Thus, the respective high-K dielectric materials (332 for the third wiring layer, and 318 of the second wiring layer), completely seal the respective bottom metal layers (330 of the third wiring layer, and 316 of the second wiring layer) from subsequently formed wiring levels.

Specifically, bottom metal layer 316 of the second wiring layer contacts contact 304 of the first wiring layer, but does not contact bottom metal layer 330 of the MIM capacitor in the third wiring layer. Further, bottom metal layer 330 of the third wiring level does not contact bottom metal layer 316 of the second wiring level, even if the capacitor in the third wiring level has been misaligned and shifted. If the capacitor in the third wiring level has been misaligned so that via 328c is located over the edge of the lower capacitor trench 312, then bottom metal layer 330 will only contact electrode 320, high-K dielectric layer 318, and substrate 308 (and not bottom metal layer 316) since bottom metal layer 316 terminates up the edges of capacitor trench 312 at top surfaces 340 and 342. As such, the opportunity for the IC of the illustrated exemplary embodiment of the present invention to short out like the prior art IC shown in FIG. 2 has been removed. As such, there is less of a need for alignment marks to be made in a wafer, and eliminates the issues that accompany alignment marks.

Further, in the exemplary embodiment illustrated in FIG. 11, bottom metal layer 330, which acts as the bottom electrode of the MIM capacitor in the third wiring layer, covers the walls of vias 328a, 328b, and 328c, as well as horizontal surface 344 between vias 328a and 328b, and covers horizontal surface 346 between vias 328b and 328c. The bottom metal layer also covers the horizontal surfaces between the edges of capacitor trench 327 and the first and last vias, e.g., vias 328a and 328c. The walls of the vias and the horizontal surfaces create a profile shape that is designed to increase the area of overlap, A, between the conductive plates of the MIM capacitor in the third wiring layer. Increasing A increases the capacitance of the MIM capacitor. Bottom metal layer 330 extends through barrier layer 322 and contacts electrode 320 in the second wiring layer.

Similarly, bottom metal layer 316, which acts as the bottom electrode of the MIM capacitor in the second wiring layer, covers the walls of vias 314a, 314b, and 314c, as well as horizontal surface 348 between vias 314a and 314b, and covers horizontal surface 360 between vias 314b and 314c. The bottom metal layer also covers the horizontal surfaces between the edges of capacitor trench 312 and the first and last vias, e.g., vias 314a and 314c. The walls of the vias and the horizontal surfaces create a profile shape that is designed to increase the area of overlap, A, between the conductive plates of the MIM capacitor in the second wiring layer. Increasing A increases the capacitance of the MIM capacitor. Bottom metal layer 316 extends through barrier layer 306 and contacts electrode 304 of the first wiring layer.

Figure 12:
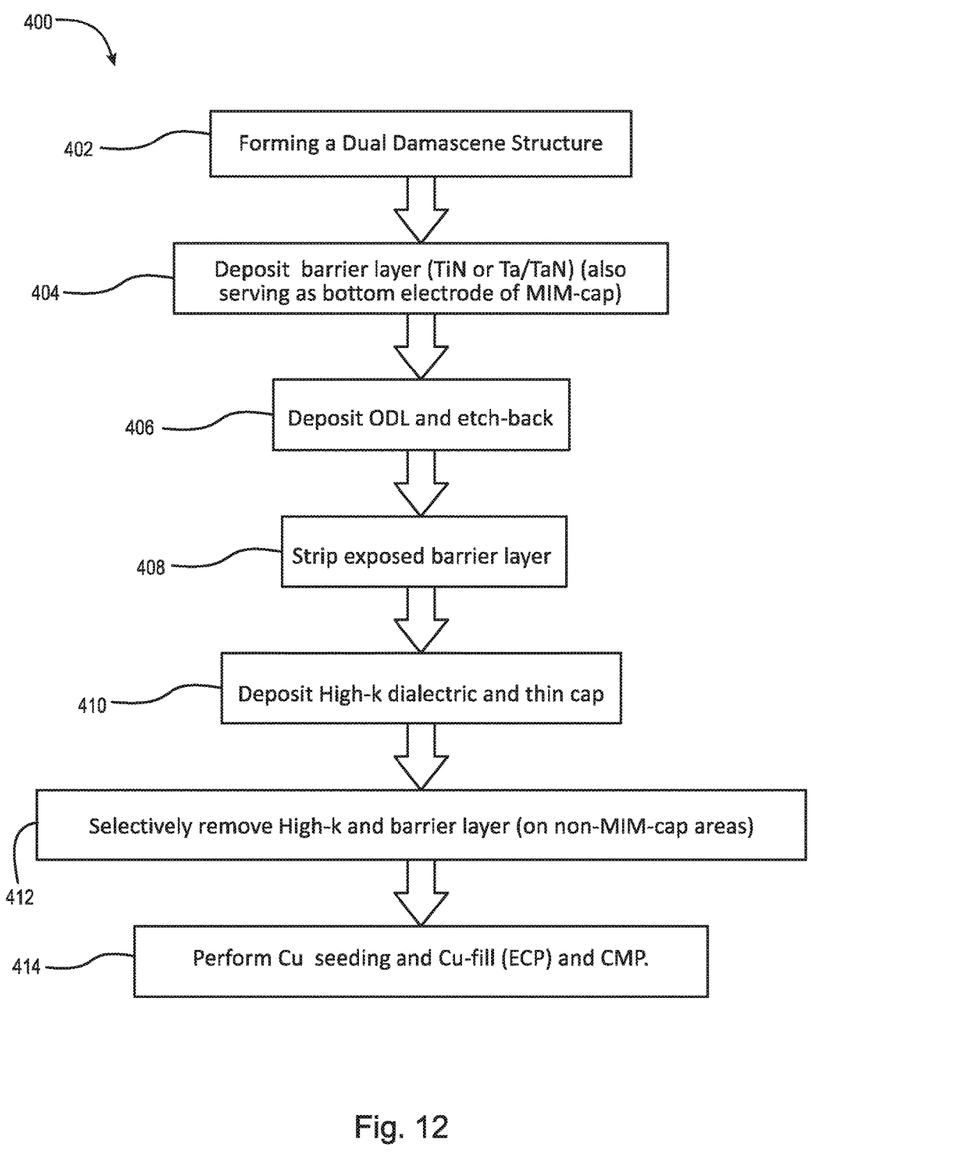

FIG. 12 is a flow diagram illustrating a method as an exemplary embodiment of the present invention for use in formation of a capacitor. Method 400 includes step 402 as forming a dual damascene structure with a capacitor portion and a via portion. A dual damascene structure can be formed by any means known in the art. For example, photomasks can be used to etch a single or a plurality of trench vias in the capacitor portion and a via in the via portion. In an exemplary embodiment of a method according to the present invention, three trench vias are formed extending from a first gap.

The dual damascene structure has a first damascene electrode layer formed in a first dielectric layer by a damascene process. The damascene process includes forming first and second openings in the first dielectric layer. Then, a metal layer (e.g., a copper layer) is formed on the first dielectric layer and filled into the first and second openings. In an exemplary embodiment, the metal layer is a copper damascene layer. A barrier layer is formed to cover the first dielectric layer and the first damascene electrode layer. The barrier layer is formed from insulating materials, for example silicon nitride (SiN).

A second dielectric layer is formed on and in contact with the insulating barrier layer. In an example embodiment, the first and second dielectric layers are oxide.

In an exemplary embodiment, the resulting dual damascene structure resulting from step 402 has a first and second wiring level and a MIM capacitor region and an interconnection region.

The MIM capacitor region of the dual damascene structure has a trench extending into the substrate of the second wiring level from the top planar surface of the substrate of the second wiring level. The trench does not extend down to the SiN barrier layer. Instead, three vias extend from the trench through the barrier layer to expose bottom the first metal contact in the MIM capacitor region.

Step 404 is depositing a metal barrier layer over the dual damascene structure formed in step 402. This barrier layer also serves as a bottom electrode of the resulting MIM capacitor. In an exemplary embodiment, the barrier layer is a metal layer formed of titanium-nitride (TiN), tantalum (Ta), or tantalum-nitride (TaN).

In step 406, an organic planarization layer (OPL or ODL) is deposited on the dual damascene structure over both the capacitor portion and the via portion. The OPL is etched-back into the first gap, but not into the trench vias. This leaves the metal barrier layer partially exposed within the first gap. The exposed parts of the metal barrier layer are then stripped 408 from the damascene structure such that the top-most surface of the metal barrier layer does not extend up to the top-most surface of the substrate in the second wiring level.

A layer of high-K material and, optionally, a thin metal capacitor is then deposited 410 onto the resulting profile of the intermediate structure. The high-K material serves as the insulator in the MIM capacitor. The metal barrier layer, the high-K material layer, and the optional metal capacitor are then selectively removed 412 from any desired non-MIM capacitor regions. In an exemplary embodiment, the layers are removed 412 by applying a photomask to the areas the layers are to be preserved and then etching the layers away in the areas not covered by the photomask.

Then, a second metal layer (e.g., a copper layer) is formed 414 on the second wiring layer and filled into the first and second openings, thereby forming the top electrode of the MIM capacitor simultaneously as conventional metal lines. The resulting structure may be subsequently planarized.

In an exemplary embodiment, method 400 is repeated to stack MIM capacitors and form the structure illustrated in FIG. 11 so that the capacitor density can be doubled. The rest of the wafer fabrication can then continue to form subsequent devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated. The corresponding structures, materials, acts, and equivalents of all means or step plus function elements in the claims below, if any, are intended to include any structure, material, or act for performing the function in combination with other claimed elements as specifically claimed.

What is claimed is:

1. A method of forming a semiconductor structure, comprising:
   forming a dual damascene structure having a capacitor trench and an interconnection trench, wherein the capacitor trench has a plurality of vias;
   forming a first electrode of the capacitor, comprising:
     depositing a first metal layer over the capacitor and interconnection trenches; and
     removing a portion of the first metal layer to create a first metal lining in the capacitor trench and a second metal lining in the interconnection trench, wherein the first and second metal linings extend only partially up the capacitor trench and the interconnection trench, respectively, and wherein the first lining extends above and between the plurality of vias;
   forming a dielectric of the capacitor;
   selectively removing the second metal lining and a portion of the high-K dielectric material covering the interconnection trench; and
   depositing a metal within said capacitor trench and said interconnection trench wherein said metal forms a second electrode of the capacitor and said metal also forms an interconnection between layers of an interconnecting structure of a semiconductor device, wherein the metal completely fills the interconnection trench and completely fills a cavity surrounded by the dielectric of the capacitor.

2. The method of claim 1, wherein the capacitor trench and the interconnection trench extend from a top surface of a wiring level in the dual damascene structure, and the removing of the portion of the first metal layer includes:
   depositing an organic planarization layer over the first metal layer;
   etching the organic planarization layer to have a second top surface within the capacitor trench below the first top surface of the wiring level, and to have a third top surface within the interconnection trench below the first top surface of the wiring level; and,
   stripping exposed portions of the first metal layer not covered by the organic planarization layer.

3. The method of claim 1, wherein the forming the dielectric comprises depositing a high-K dielectric material over the dual damascene structure and the first and second metal linings, wherein the high-K dielectric material creates a seal over the first and second metal linings.

4. The method of claim 3, wherein the selectively removing comprises applying a preserve mask over the capacitor trench and leaving the interconnection trench exposed, etching the high-K dielectric material and the second metal lining from the interconnection trench, and removing the preserve mask.

5. The method of claim 1, wherein the capacitor trench has a plurality of vias.

6. The method of claim 5, wherein the first electrode, the dielectric, and the second electrode of the capacitor are formed within the plurality of vias in the capacitor trench, and formed on surfaces between the plurality of vias in the capacitor trench.

7. A method of forming a semiconductor structure, comprising:
  forming a dual damascene structure having a first capacitor trench and a first interconnection trench, wherein the first capacitor trench has a plurality of vias;
  forming a first electrode of the first capacitor, wherein the first electrode extends only partially up the capacitor trench and above and between the plurality of vias;
  forming a first dielectric of the first capacitor;
  depositing a first metal within said first capacitor trench and said first interconnection trench wherein said first metal forms a second electrode of the first capacitor and said first metal also forms a first interconnection between wiring layers of the semiconductor device, wherein the metal completely fills the first interconnection trench and completely fills a cavity surrounded by the first dielectric of the first capacitor;
  forming a subsequent wiring level comprising a second capacitor trench for a second capacitor and a second interconnection trench for a second interconnection, wherein the second capacitor trench has a plurality of vias;
  forming a third electrode of the second capacitor, wherein the third electrode extends only partially up the second capacitor trench and above and between the plurality of vias;
  forming a second dielectric of the second capacitor; and,
  depositing a second metal within said second capacitor trench and said second interconnection trench wherein said second metal forms a fourth electrode of the second capacitor and said second metal also forms a second interconnection between wiring layers of the semiconductor device and in contact with the first interconnection, wherein the second metal completely fills the second interconnection trench and completely fills a cavity surrounded by the second dielectric of the second capacitor.

8. A semiconductor structure for an interconnecting structure of a semiconductor device, comprising:
  a dual damascene structure having:
    a capacitor trench for a capacitor, the capacitor including a first electrode, a second electrode, and a high-K dielectric between the first and second electrodes, the high-k dielectric configured to seal the first electrode from the second electrode and configured to seal the first electrode from subsequent wiring layers of the interconnecting structure of the semiconductor device, wherein the capacitor trench includes a plurality of vias and the first electrode is a metal lining that extends only partially up the capacitor trench and above and between the vias, wherein the second electrode comprises a metal that completely fills a cavity surrounded by the dielectric of the capacitor; and,
    an interconnection trench for a metal interconnection to form an interconnection between the interconnecting structure of the semiconductor device, wherein the interconnection trench includes a metal that completely fills the interconnection trench.

9. The semiconductor structure of claim 8, wherein the first electrode, the high-K dielectric, and the second electrode are formed within the plurality of vias in the capacitor trench and formed on surfaces between the plurality of vias in the capacitor trench.

10. The semiconductor structure of claim 8, further comprising:
  a subsequent wiring layer having a second capacitor trench for a second capacitor including a third electrode, a fourth electrode, and a second high-K dielectric between the third and fourth electrodes, the second high-K dielectric configured to seal the third electrode from the fourth electrode and configured to seal the third electrode from other subsequent wiring layers of the interconnecting structure of the semiconductor device; and,
  a second interconnection trench for a second metal interconnection to form a second interconnection between wiring layers of the interconnecting structure of the semiconductor device.

11. The semiconductor structure of claim 10, wherein the first capacitor and the second capacitor are stacked on top of each other, wherein the second electrode of the first capacitor contacts the third electrode of the second capacitor, and the high-K dielectric of the first capacitor seals the first electrode of the capacitor from the third electrode of the second capacitor.

12. The semiconductor structure of claim 10, wherein the second capacitor trench includes a second plurality of vias.

13. The semiconductor structure of claim 12, wherein the third electrode, the second high-K dielectric, and the fourth electrode of the second capacitor are formed within the second plurality of vias in the second capacitor trench and formed on surfaces between the second plurality of vias in the second capacitor trench.

* * * * *